US 6,608,446 B1

United States Patent
Coumou

(10) Patent No.: US 6,608,446 B1
(45) Date of Patent: Aug. 19, 2003

(54) METHOD AND APPARATUS FOR RADIO FREQUENCY (RF) METROLOGY

(75) Inventor: David J. Coumou, Webster, NY (US)

(73) Assignee: ENI Technology, Inc., Rochester, NY (US)

(*) Notice: Subject to any disclaimer, the term of this patent is extended or adjusted under 35 U.S.C. 154(b) by 0 days.

(21) Appl. No.: 10/082,645

(22) Filed: Feb. 25, 2002

(51) Int. Cl.[7] .................................................. H01J 7/24
(52) U.S. Cl. .......................... 315/111.21; 315/111.01; 324/464
(58) Field of Search ................... 315/111.21, 111.31, 315/111.41, 111.51, 111.81, 111.01; 324/464, 693, 95, 117, 126; 333/24 R; 118/723 I; 156/345.15, 345.13

(56) References Cited

U.S. PATENT DOCUMENTS

| 5,041,791 A | 8/1991 | Ackerman et al. ........... 324/318 |
| 5,175,472 A | 12/1992 | Johnson, Jr. et al. ... 315/111.21 |
| 5,325,019 A | 6/1994 | Miller et al. ............. 315/111.21 |
| 5,383,019 A | 1/1995 | Farrell et al. ................ 356/316 |
| 5,536,928 A | 7/1996 | Seigel .......................... 235/462 |
| 5,565,737 A | 10/1996 | Keane .................... 315/111.21 |
| 5,770,922 A | 6/1998 | Gerrish et al. ........... 315/111.21 |
| 5,808,415 A | 9/1998 | Hopkins ................. 315/111.21 |
| 5,834,931 A | * 11/1998 | Moore et al. ................. 324/95 |
| 5,861,752 A | * 1/1999 | Klick ........................... 324/464 |
| 5,939,886 A | * 8/1999 | Turner et al. ................ 324/464 |
| 5,971,591 A | * 10/1999 | Vona et al. .................. 700/220 |
| 6,061,006 A | 5/2000 | Hopkins ....................... 341/61 |

* cited by examiner

*Primary Examiner*—Don Wong
*Assistant Examiner*—Ephrem Alemu
(74) *Attorney, Agent, or Firm*—Harness, Dickey & Pierce, P.L.C.

(57) ABSTRACT

A radio frequency (RF) probe head apparatus is provided for measuring voltage and current of an RF signal in a sampled transmission line. The probe head apparatus includes a conductive housing, a bus inside the conductive housing, a pair of connectors mounted on the conductive housing and configured to pass an RF signal into and out of the housing via the bus, a voltage pick-up board within the housing, and a current pickup board within the housing. The voltage pickup board has an analog processor responsive to an electric field around the bus to produce a first DC output indicative of a root-mean-square (RMS) value of the electric field. The current pick-up board has a second analog processor responsive to a magnetic field around the bus to produce a second DC output indicative of an RMS value of the magnetic field.

20 Claims, 4 Drawing Sheets

METHOD AND APPARATUS FOR RADIO FREQUENCY (RF) METROLOGY

FIELD OF THE INVENTION

The present invention relates to plasma generation equipment, and more particularly to apparatus and methods for measuring radio frequency (RF) power supplied to an RF plasma generator.

BACKGROUND OF THE INVENTION

To obtain better control of etching or deposition characteristics of a silicon wafer or other workpiece in a plasma chamber, it is conventional to employ a probe at a power input to the plasma chamber to detect voltage and current of a radio frequency (RF) wave as it enters the plasma chamber. One such probe utilizes a separate probe voltage and current pick-up device to sample the voltage and current of applied RF power as it enters an input of the plasma chamber. The probe pick-up has a shield or housing that electrically seals the pick-up. A voltage pick-up board inside the shield or housing is coupled via triax cables to a probe circuit arrangement housed in a separate chassis. A local oscillator and a pair of mixers produce separate baseband voltage and current signals, which are digitized utilizing a matched stereo analog to digital (A/D) converter and digitally processed utilizing a digital signal processor (DSP). The DSP is coupled via an interface to a feedback loop of the local oscillator to form a closed loop, and is also coupled to an external serial interface. The latter may in turn be coupled to controls for the plasma process arrangement.

Probes of the type described above provide satisfactory performance in many applications. However, group delays resulting from the signal processing performed in the probe circuit arrangement may reduce the speed or stability of some control systems.

SUMMARY OF THE INVENTION

There is therefore provided, in one aspect of the present invention, a radio frequency (RF) probe head apparatus for measuring voltage and current of an RF signal in a sampled transmission line. The probe head apparatus includes a conductive housing, a bus inside the conductive housing, a pair of connectors mounted on the conductive housing and configured to pass an RF signal into and out of the housing via the bus, a voltage pick-up board within the housing, and a current pickup board within the housing. The voltage pickup board has an analog processor responsive to an electric field around the bus to produce a first DC output indicative of a root-mean-square (RMS) value of the electric field. The current pick-up board has a second analog processor responsive to a magnetic field around the bus to produce a second DC output indicative of an RMS value of the magnetic field.

In another aspect, the present invention provides an RF probe head for measuring RMS electrical and magnetic fields in a sampled transmission line. In this aspect, the probe head includes a conductive housing, a pair of RF ports configured to couple an RF signal through the housing, circuitry within the housing configured to produce a first DC output proportional to an RMS value of an electric field produced by the RF signal inside the conductive housing and to produce a second DC output proportional to an RMS value of a magnetic field produced by the RF signal inside the conductive housing, and a pair of ports configured to couple the first DC output and the second DC output out of the conductive housing.

In yet another aspect, the present invention provides a method for measuring RF power in an RF probe head. The method includes passing RF power through an RF probe head having a conductive housing, sensing electric and magnetic fields produced by the RF power within the conductive housing to produce a first electrical signal representative of the electric field and a second electrical signal representative of the magnetic field within the housing, and processing the first electrical signal and the second electrical signal to produce a first DC output representative of an RMS value of the electrical field and a second DC output representative of an RMS value of the magnetic field. All of the processing takes place entirely within the conductive housing.

Configurations of the present invention provide highly accurate and repeatable measurements of RF line voltage and current, even at high RF power levels. Moreover, group delay resulting from signal processing performed in probe circuit arrangements is reduced relative to known conventional configurations.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

As used herein, "analog processing" and "analog circuitry" refer to processing or circuitry that does not convert any signal having a continuous voltage (or current) range into a digitized signal having discrete values representative of ranges of continuous values, except that the production of a binary value indicative of whether a signal has a positive or negative value is not excluded by the term "analog" as used herein. Analog circuitry need not be linear, and thus encompasses, among other things, circuitry that rectifies or that produces the absolute value of a signal.

Although the term "bus" as used herein is intended to encompass wire conductors, limitation to this particular shape is not intended.

Figure 1:
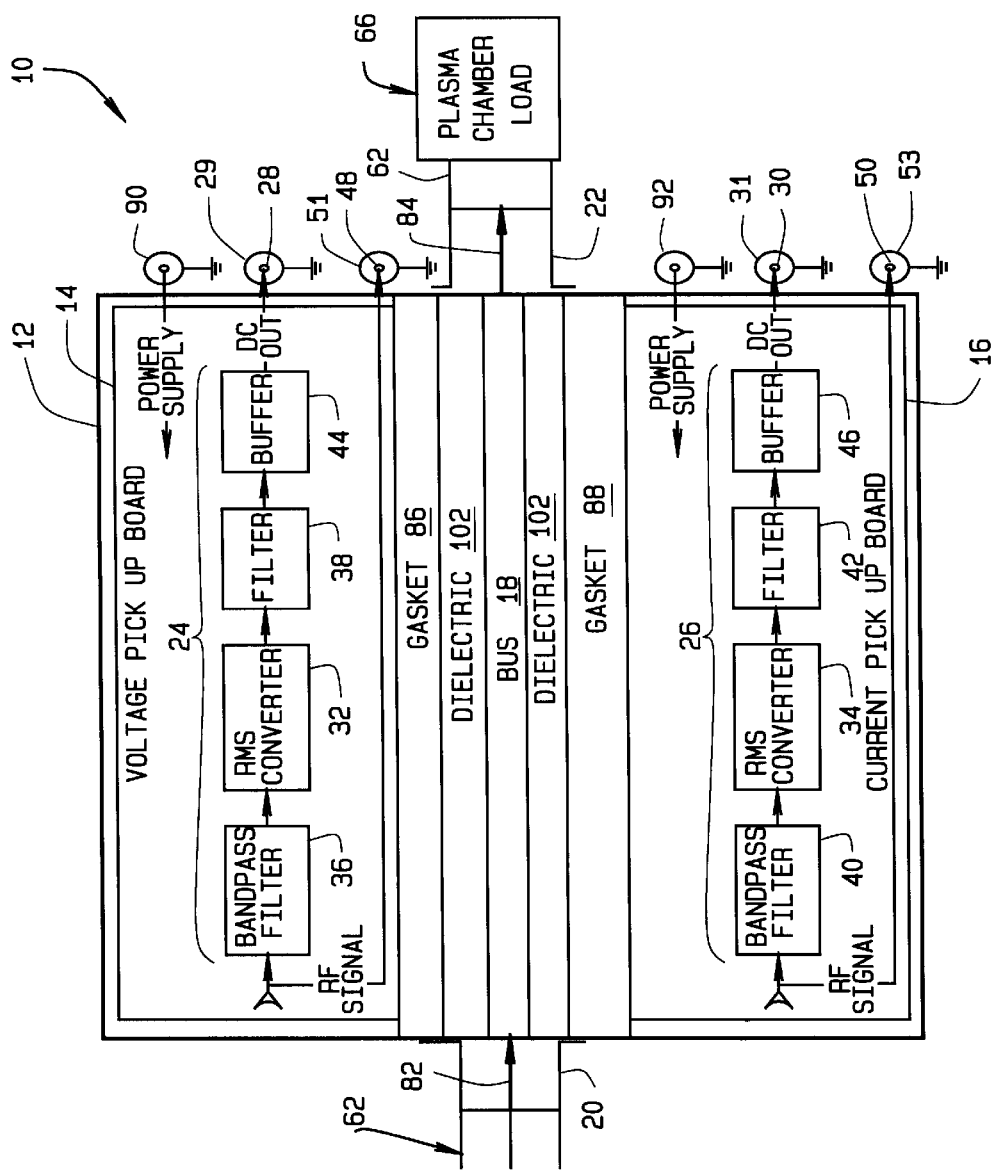
FIG. 1 is a block diagram of one configuration of an RF probe head.

In one configuration and referring to FIG. 1, the present invention provides a radio frequency probe head 10 that measures voltage and current of an RF signal in a sampled transmission line. The probe apparatus is contained within a small conductive enclosure 12 that completely encloses voltage pick-up board 14 and current pick-up board 16. Conductive enclosure 12 also completely encloses a bus 18 that is electrically coupled to connectors 20 and 22. In one configuration, connectors 20 and 22 are each coaxial connectors.

Connectors 20 and 22 are RF ports that conduct an RF signal into and out of enclosure 12, respectively. An outer conductor of connectors 20 and 22 is electrically connected to enclosure 12. Inner conductors of connectors and 22 are separated from the outer conductors by a dielectric (not shown in FIG. 1), and are electrically connected to each other by bus 18.

Voltage pick-up board 14 is responsive to an electric field inside enclosure 12 as a result of an RF signal passing through connectors 20 and 22. More particularly, voltage pick-up board 14 has circuitry including a first analog processor 24 that is responsive to an electric field around bus 18 inside enclosure 12. Similarly, current pick-up board 16 has circuitry including a second analog processor 26 that is responsive to a magnetic field around bus 18 inside enclosure 12. One example of a suitable arrangement for sensing electric and magnetic fields around an RF conductor (and thus, RF voltage and current of applied RF power) is shown in U.S. Pat. No. 5,770,922, issued Jun. 23, 1998 to Gerrish et al., entitled "Baseband V-I probe."

Circuitry included in first analog processor 24 produces a first DC output at port 28 that is indicative of a root-mean-square (RMS) value of the electric field. Circuitry included in second analog processor 26 produces a second DC output at port 30 that is indicative of an RMS value of the magnetic field around bus 18 inside enclosure 12. In one configuration, voltage pick-up board 14, current pick-up board 16, first analog processor 24 and second analog processor 24 are contained entirely within enclosure 12. Ports 28 and 30 couple the first and second DC outputs, respectively, out of enclosure 12.

First analog processor 24 and second analog processor 26 contain analog RMS converters 32 and 34, respectively. In one configuration, analog RMS converters 32 and 34 are Analog Devices AD8361 surface mount RMS converters. Conversion devices 32 and 34 are mounted on respective pick-up boards 14 and 16.

First analog processor 24 also includes a first bandpass filter 36 responsive to an electrical signal representative of the electric field around bus 18. First bandpass filter 36 has an output coupled to an input of first analog RMS converter 32. An output of analog RMS converter 32 is coupled to a first lowpass filter 38. Similarly, second analog processor 26 includes a second bandpass filter 40 responsive to an electrical signal representative of the magnetic field around bus 18. Second bandpass filter 40 has an output coupled to an input of second RMS converter 34, and an output of analog RMS converter 34 is coupled to a second lowpass filter 42.

In one configuration, first bandpass filter 36 and second bandpass filter 40 are both third order linear phase equiripple filters configured to reduce harmonics of RF power applied to and passing through probe head 10. The DC output of RMS converters 32 and 34 are also filtered to remove any ripple voltage that might contaminate measurements. Buffer amplifiers 44 and 46 are provided for the outputs of first bandpass filter 36 and second bandpass filter 40, respectively. Buffer amplifiers 44, 46 are responsive to electrical signals output by bandpass filters 36 and 40, respectively, to produce buffered-electrical signals. One configuration of the probe head sensor is limited to a single RF frequency, and the 3 dB point is set is at ±10% of the RF frequency utilizing filters 36, 38, 40 and 42, with attenuation greater than 35 dB at ±50% of the RF frequency.

In operation, RF power is passed through enclosure 12, and voltage pick-up board 14 senses the electric field produced by RF power within conductive enclosure 12 to produce a first electrical signal representative of the electric field. Similarly, current pick-up board 16 senses the magnetic field produced by the RF current within conductive enclosure 12 to produce a second electrical signal representative of the magnetic field. The first electrical signal and the second electrical signal are processed to produce a first DC output representative of an RMS value of the electric field and a second DC output representative of an RMS value of the magnetic field. This processing takes place entirely within conductive enclosure 12, and is performed entirely with analog circuitry. The first and the second electrical signals are filtered to remove harmonics of the RF power passed through probe head 10.

In one configuration, voltage pick-up board 14 is configured to produce a first DC output 28 that is proportional to an RMS voltage of an RF signal on bus 18, and current pick-up board 16 is configured to produce a second DC output 30 proportional to an RMS current of an RF signal on bus 18. Also in one configuration, voltage pick-up board 14 is coupled to the electric field around bus 18 to produce a first sampled RF signal 48 and current pick-up board 16 is coupled to the magnetic field to produce a second sampled RF signal 50. Signals 48 and 50 are output to external RF connectors, for example, SMB connectors 51 and 53, respectively, to make signals 48 and 50 accessible outside of enclosure 12.

Figure 2:
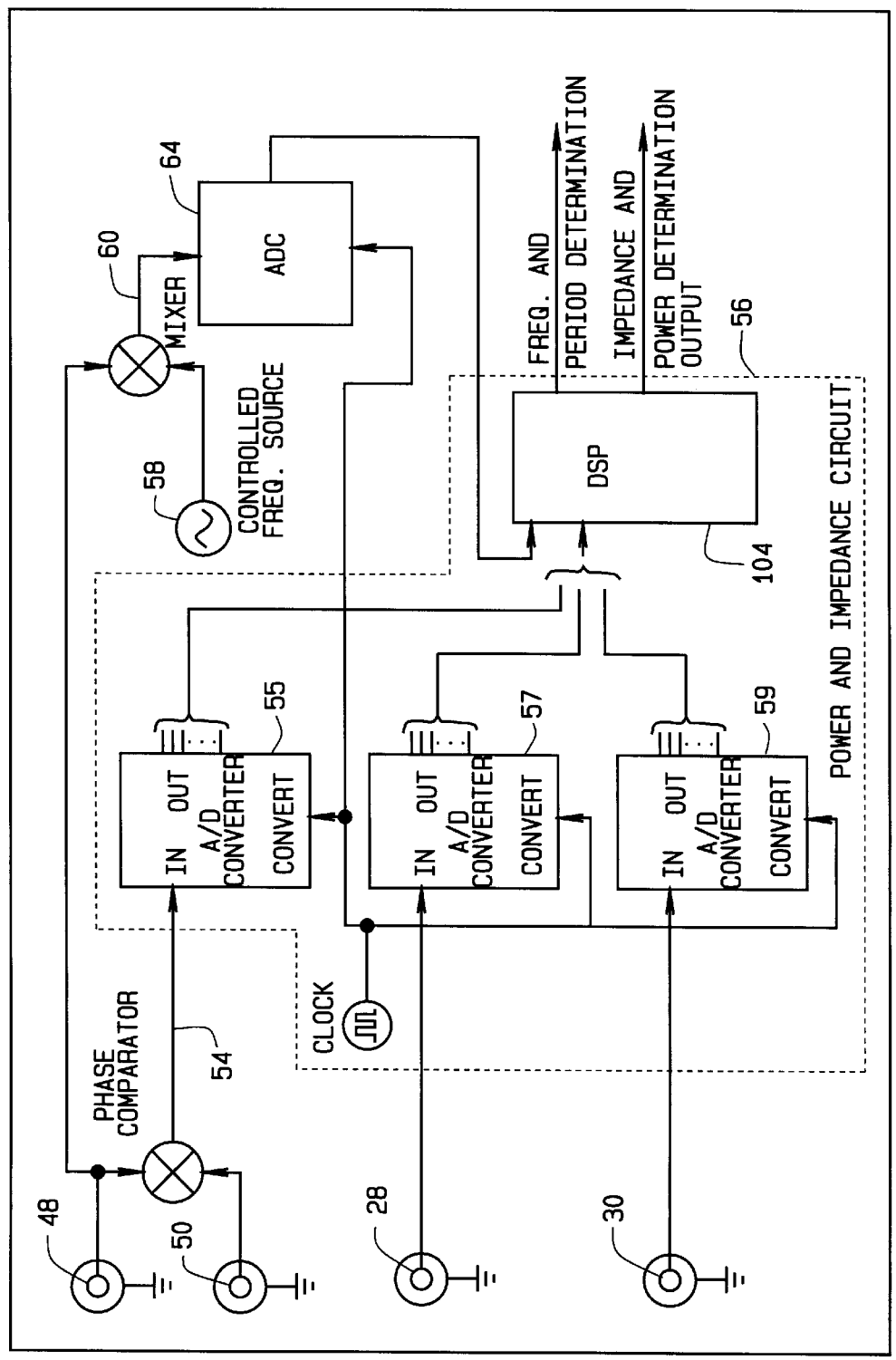
FIG. 2 is a block diagram of a phase comparator printed circuit board.

In one configuration and referring to FIGS. 1 and 2, a phase comparator printed circuit board 52 is configured to mount directly to SMB connectors 51 and 53 and to derive a phase difference signal 54 representing a phase difference between RF signal 48 and RF signal 50. DC outputs 28 and 30 representing RMS signals and phase difference signal 54 are digitized by synchronized converters 55, 57, and 59 of a power and impedance circuit 56 for determination of the impedance of a plasma chamber load 66 (shown in FIG. 1) and of the power of the RF signal applied to load 66, which is electrically coupled to probe head 10 via bus 18. A digital signal processor (DSP) 104 is used in one configuration for making the impedance and power determination. In one variation of this configuration, at least one of RF signals 48 and 50 is mixed with a controlled frequency source 58. Difference frequency 60 is digitized by analog to digital converter (ADC) 64 and a resulting digital signal is used by DSP !104 to determine the period of difference frequency 60 and the frequency present on RF transmission line 62 (shown in FIG. 1). Difference frequency 60 and/or the determination of its period and/or the determination of the frequency present on transmission line can be utilized in frequency tuning systems to provide appropriate calibration factors over the bandwidth of probe 10. In one configuration, for example, DSP 104 is configured to measure a frequency of the RF signal applied to load 66.

In one configuration, a linear conversion is provided with an offset voltage of about 100 mV and a full-scale output of 5 volts DC for a 5 KW chamber. For scaling to higher power levels, attenuation can be provided for electrical signals representing the sensed electric and magnetic fields.

For unit-to-unit repeatability, the slope of the transfer function of transmission line RMS current and voltage to DC volts in one configuration is less than 1%. The signal to noise ratio of the probe head is better than 50 dB over the entire power range. For control and monitoring of pulsing RF power systems, the step response of the RMS probe head is less than 10 microseconds.

Figure 3:
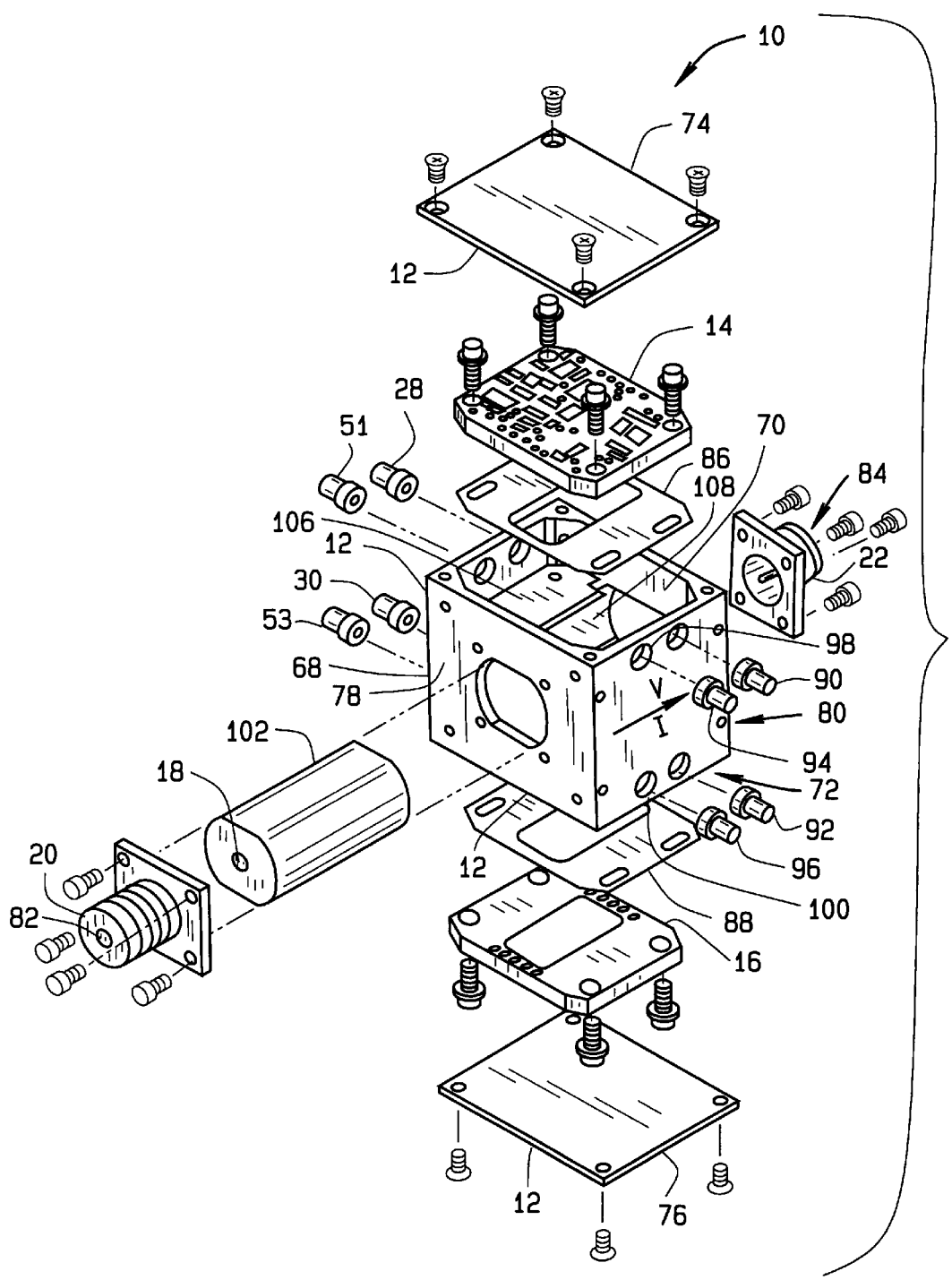
FIG. 3 is an exploded perspective view showing the assembly of parts for an RF probe head.

In one configuration and referring to FIG. 3, probe head 10 comprises a conductive housing 68, for example, an aluminum housing 68. A center portion of conductive housing 68 is bored and bus 18 surrounded by a dielectric material 102 (for example, boron nitride or TEFLON®) is inserted in housing 68 between first end 70 and second end 72 of the bore through housing 68. In one configuration, bus 18 is a silver plated copper conductor. Also in one configuration, dielectric material 102 is boron nitride, which provides a thermal path between bus 18 and conductive housing 68. Dimensions of conductive housing 68 can be approximately 5 to 7.5 cm (about 2 to 3 inches) on a side when surface mount components are utilized for construction of pickup boards 14 and 16. A first conductive plate 74 covers open first end 70 and a second conductive plate 76 covers open second end 72. Two RF ports comprising connectors 20 and 22 are mounted on opposite faces 78 and 80, respectively, of conductive housing 68. Center conductors 82 and 84 of connectors 20 and 22 are electrically connected by bus 18 inside conductive enclosure 12. Conductive gaskets 86 and 88 disposed between bus 18 and open ends 70 and 72, respectively, provide an RF conductive bond between ground planes (not shown) on pick-up boards 14 and 16 and conductive housing 68. In one configuration, conductive gaskets 86 and 88 are silver plated copper gaskets.

Voltage pick-up board 14 is mounted between gasket 86 and open end 70, and current pick-up board 16 is mounted between gasket 88 and open end 72. Ports 28 and 30 carry out DC signals representative of RMS measurements made by analog processors 24 and 26 (not shown in FIG. 3), respectively. SMB connectors 51 and 53 carry out sampled RF signals. Additional connectors 90 and 92 are provided to supply 5 volt DC power to boards 14 and 16, respectively. Auxiliary connectors 94 and 96 may be used for test purposes, or connectors 94 and 96 and their corresponding holes 98 and 100 in body 68 may be omitted altogether.

Figure 4:
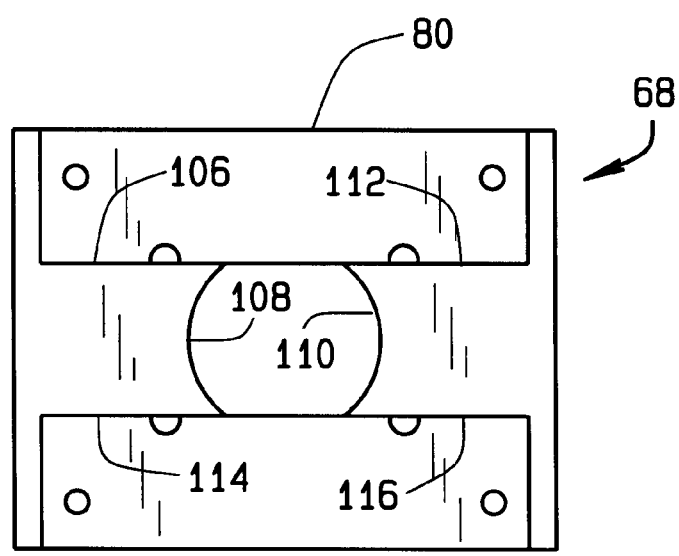
FIG. 4 is a sectional elevation view of a configuration of the conductive housing of FIG. 3 from the inside of the housing.

A sectional elevation view of one configuration of conductive housing 68 is shown in FIG. 4. The view of FIG. 4 is from the inside of conductive housing 68 looking towards face 80. (A view towards face 78 would be essentially identical.) Gasket 86 (shown in FIG. 3) is mounted on surfaces 106 and 112, while gasket 88 is mounted on surfaces 114 and 116. Surfaces 106, 112, 114 and 116 extend between face 78 and face 80. An outer surface of dielectric material 102, which surrounds bus 18, fits tightly between surfaces 108 and 110.

In various configurations, the present invention provides DC signals that are proportional to electric and magnetic fields on a sampled transmission line in a low cost, compact probe head sensor that users can apply to semiconductor chambers to monitor or control RF voltage and/or current. Because neither programmed processor nor analog to digital conversion are required for generation of a DC signal proportional to a true RMS value of the RF signal in probe head 10, group delay is significantly reduced because the RMS conversion is achieved using analog circuitry. Bandpass filters and attenuators reduce signal contamination from harmonic sources. As a result, plasma monitoring and control systems using configurations of probe head 10 exhibit improved response time compared to circuits that require external circuitry or external digital circuitry for RMS determination. Higher RF powers and other probe head frequency responses can be accommodated readily, for example, by providing the appropriate bandpass filter and attenuator combinations for the sensed RF signals. In addition, configurations of probe head 10 can be conveniently mounted on plasma chambers.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A radio frequency (RF) probe head apparatus for measuring voltage and current of an RF signal in a sampled transmission line, said probe head apparatus comprising:

a conductive housing;

a bus inside the conductive housing;

a pair of connectors mounted on said conductive housing configured to pass an RF signal into and out of said housing via said bus;

a voltage pick-up board within said housing having a first analog processor responsive to an electric field around said bus to produce a first DC output indicative of a root-mean-square (RMS) value of said electric field; and a current pick-up board within said housing having a second analog processor responsive to a magnetic field around said bus to produce a second DC output indicative of an RMS value of said magnetic field.

2. An apparatus in accordance with claim 1 wherein said second analog processor comprises an analog RMS converter.

3. An apparatus in accordance with claim 1 wherein said first analog processor comprises an analog RMS converter.

4. An apparatus in accordance with claim 3 wherein said second analog processor comprises an analog RMS converter.

5. An apparatus in accordance with claim 4 wherein said first analog processor further comprises a first bandpass filter responsive to an electrical signal representative of said electric field, said first bandpass filter having an output coupled to an input of said first analog RMS converter, and a first lowpass filter responsive to an output of said first RMS converter to produce a first electrical signal representative of said electric field; and said second analog processor further comprises a second bandpass filter responsive to an electrical signal representative of said magnetic field, said second bandpass filter having an output coupled to an input of said second analog RMS converter, and a second lowpass filter responsive to an output of said second RMS converter to produce a second electrical signal representative of said magnetic field.

6. An apparatus in accordance with claim 5 further comprising a first buffer responsive to said first electrical signal to produce a first buffered electrical signal and a second buffer responsive to said second electrical signal to produce a second buffered electrical signal.

7. An apparatus in accordance with claim 1 wherein said voltage pick-up board is configured to produce said first DC output proportional to an RMS voltage of an RF signal on said bus, and said current pick-up board is configured to produce said second DC output proportional to an RMS current of an RF signal on said bus.

8. An apparatus in accordance with claim 1 wherein said voltage pick-up board is coupled to said electric field to produce a first sampled RF signal, and said current pick-up board is coupled to said magnetic field to produce a second sampled RF signal, and further comprising a phase comparator responsive to said first sampled RF signal and said second sampled RF signal to produce a signal indicative of a phase difference between said first sampled RF signal and said second sampled RF signal.

9. An apparatus in accordance with claim 8 wherein said first sampled RF signal and said second sampled RF signals are provided at external RF connectors on said housing, and said phase comparator is mounted to said external RF connectors outside said housing.

10. An apparatus in accordance with claim 8 further comprising a power and impedance circuit responsive to said signal indicative of said phase difference, said first DC output, and said second DC output to produce signals indicative of the impedance of a load to which the RF signal is being applied and an amount of power in the RF signal applied to the load.

11. An apparatus in accordance with claim 8 further comprising a digital signal processor configured to measure a frequency of the RF signal.

12. An apparatus in accordance with claim 1 electrically coupled to a plasma chamber.

13. An apparatus in accordance with claim 12 mounted on a plasma chamber.

14. A radio frequency (RF) probe head for detecting RMS electrical and magnetic fields in a sampled transmission line, said probe head comprising:

a conductive housing, a pair of RF ports configured to couple an RF signal through said housing;

circuitry within said housing configured to produce a first DC output proportional to a root-mean-square (RMS) value of an electric field produced by said RF signal inside said conductive housing and to produce a second DC output proportional to an RMS value of a magnetic field produced by said RF signal inside said conductive housing; and a pair of ports configured to couple said first DC output and said second DC output out of said conductive housing.

15. A probe head in accordance with claim 14 wherein said circuitry includes filters configured to reduce harmonics of an RF signal applied to said probe head.

16. A probe head in accordance with claim 14 wherein said conductive housing comprises a hollow body having a first open end and an opposite open end, a first plate covering said first open end and a second plate covering said second open end; said pair of RF ports comprise a pair of connectors on opposite faces of said hollow body having center conductors electrically connected by a bus inside said housing; and said circuitry comprises a voltage pick-up board mounted inside said housing between said bus and said first plate, and a current pick-up board mounted inside said conductive housing between said bus and said second plate.

17. A method for measuring radio frequency (RF) power in an RF probe head comprising:

passing RF power through an RF probe head having a conductive housing;

sensing electric and magnetic fields produced by the RF power within the conductive housing to produce a first electrical signal representative of the electric field and a second electrical signal representative of the magnetic field within the housing; and processing the first electrical signal and the second electrical signal to produce a first DC output representative of a root-mean-square (RMS) value of the electrical field and a second DC output representative of an RMS value of the magnetic field;

wherein said processing takes place entirely within the conductive housing.

18. A method in accordance with claim 17 wherein said processing is performed entirely with analog circuitry.

19. A method in accordance with claim 17 wherein said processing includes filtering of the first electrical signal and the second electrical signal to remove harmonics of the RF power passed through the RF probe head.

20. A method in accordance with claim 19 wherein said processing is performed entirely with analog circuitry.

* * * * *